United States Patent [19]

Perrine

[11] 4,338,517
[45] Jul. 6, 1982

[54] SHAFT ROTATION SENSOR

[76] Inventor: Warren L. Perrine, Paraiso Hot Springs, Soledad, Calif. 93960

[21] Appl. No.: 144,376

[22] Filed: Apr. 28, 1980

Related U.S. Application Data

[63] Continuation-in-part of Ser. No. 3,108, Jan. 15, 1979, abandoned.

[51] Int. Cl.³ .......................... G01D 5/36; G01P 3/36
[52] U.S. Cl. ............................... 250/231 SE; 403/345
[58] Field of Search ............. 250/231 SE; 340/347 P; 324/175; 403/345, 332, 374

[56] References Cited

U.S. PATENT DOCUMENTS 3,400,275  9/1968  Trump .
3,417,650 12/1968  Varrin ............................. 403/345 X
3,894,232  7/1975  Lapesa ........................... 250/231 SE
3,900,732  8/1975  Costales ......................... 250/231 SE
3,995,156 11/1976  Angersbach et al. ......... 250/231 SE
4,132,890  1/1979  Garcia et al. .................. 250/231 SE Primary Examiner—David C. Nelms
Assistant Examiner—Edward P. Westin
Attorney, Agent, or Firm—Gausewitz, Carr, Rothenberg & Edwards

[57] ABSTRACT

A modular incremental rotary shaft encoder is preassembled within its housing and then installed and aligned upon the shaft of which rotation is to be sensed. The encoder housing loosely confines a thin disc assembly having a shaft receiving aperture dimensioned to be a press fit upon the shaft. The encoder is installed simply by pressing the housing and the disc assembly therein upon the shaft and fixing the housing to the shaft support. The disc assembly plane of rotation and the disc to detector gap are fixed by inserting a slender elongated installation tool through the housing cover into engagement with the disc assembly and pressing and bending the disc assembly against a fixed stop while the shaft and disc assembly are rotated. A pointed tool is inserted through the housing against the disc assembly to hold the latter against rotation while the shaft is carefully rotated to provide for rotational indexing of the disc assembly.

41 Claims, 9 Drawing Figures

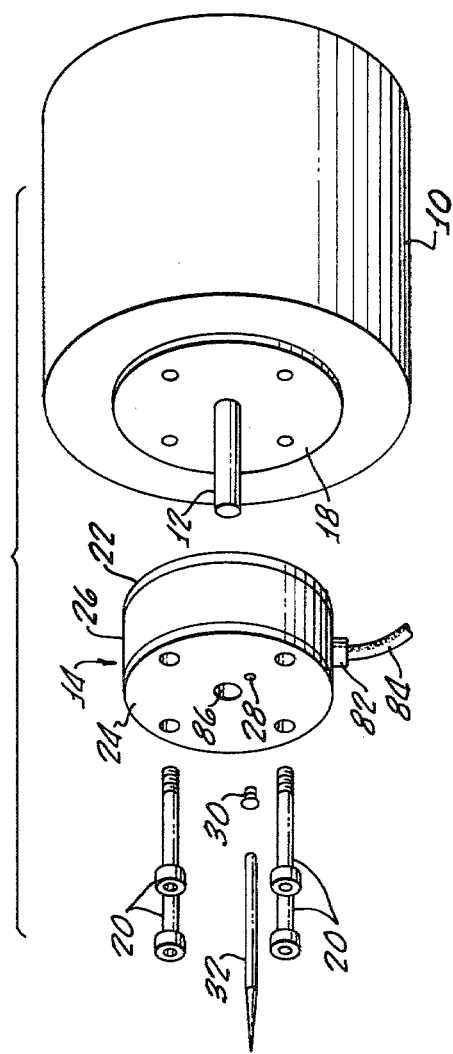
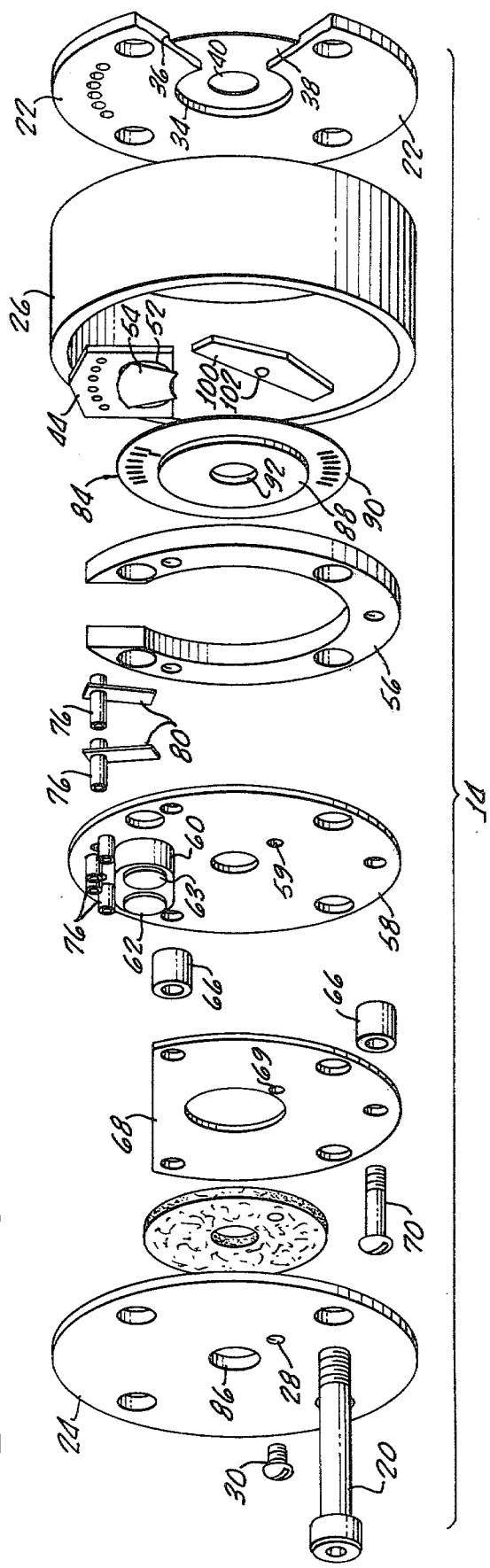
Fig. 1.
Fig. 4.

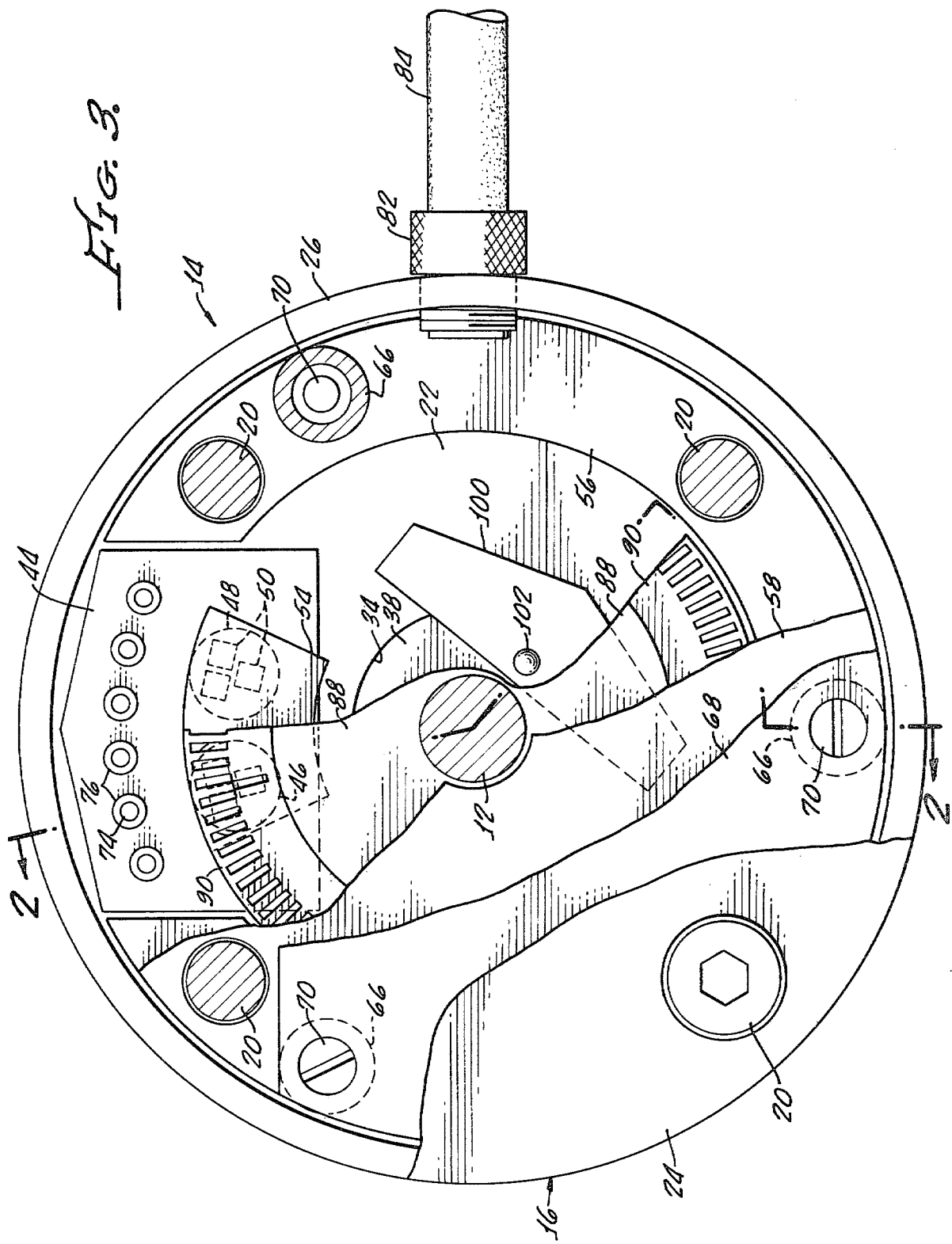

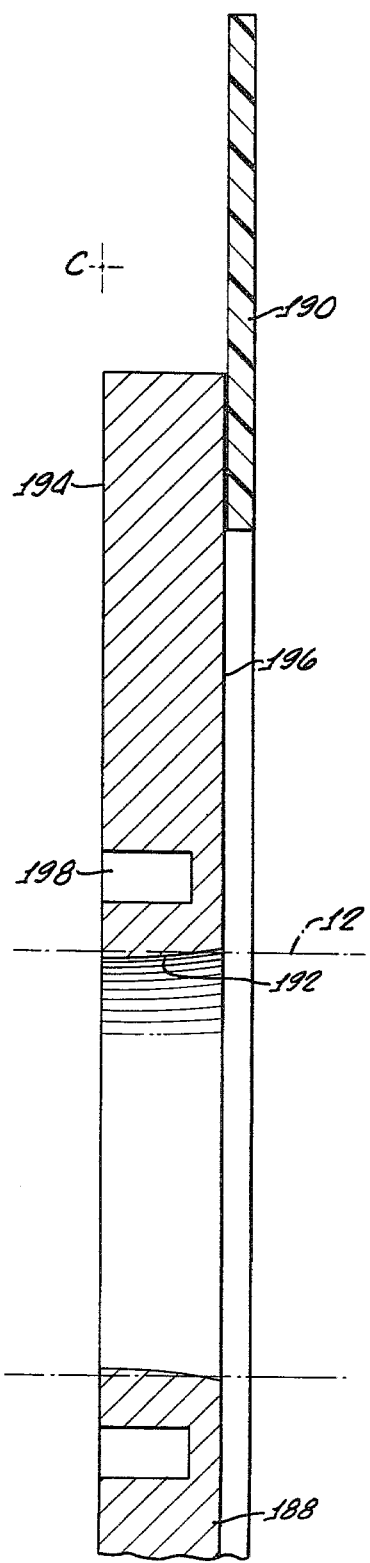
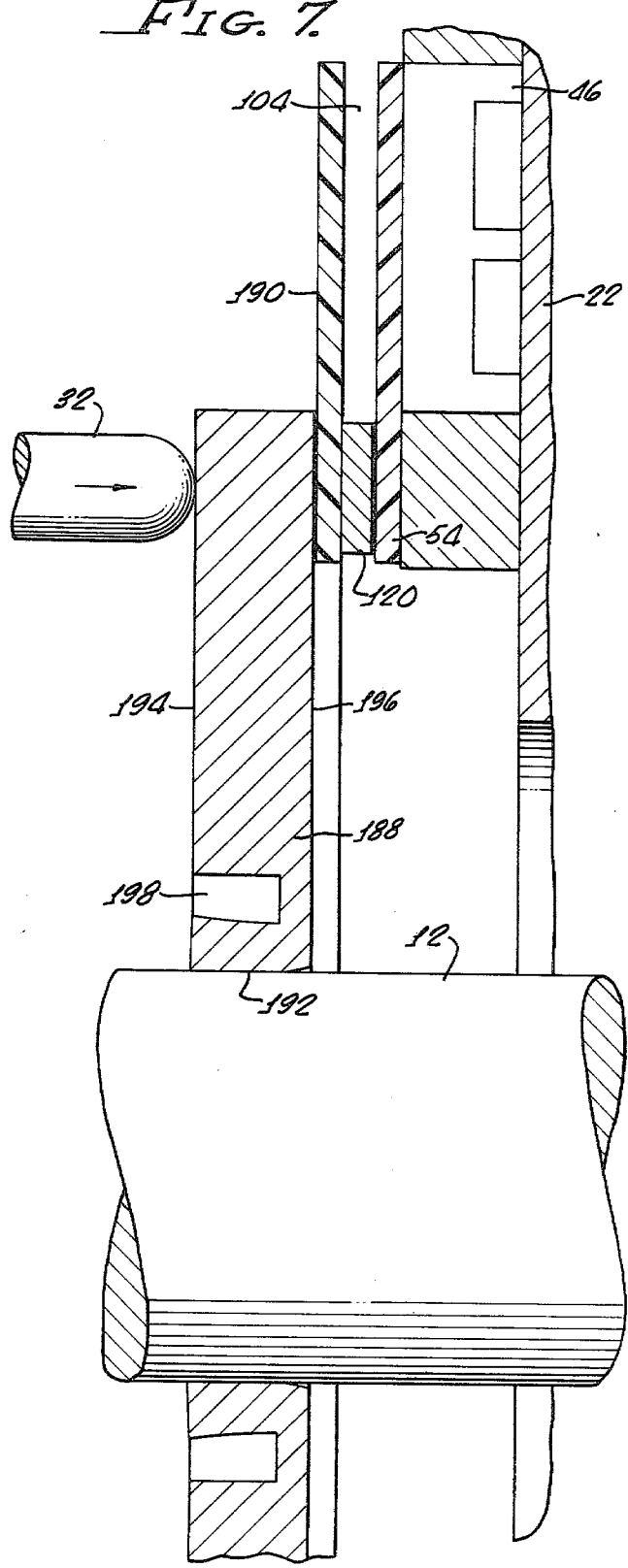

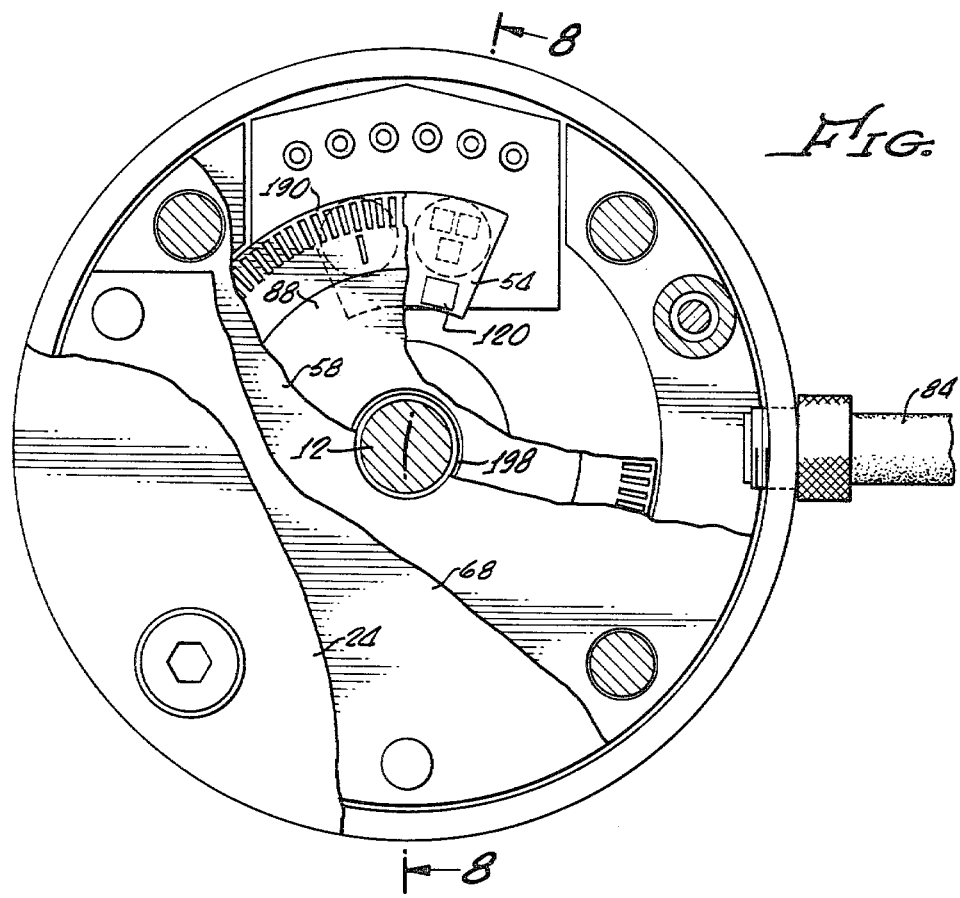
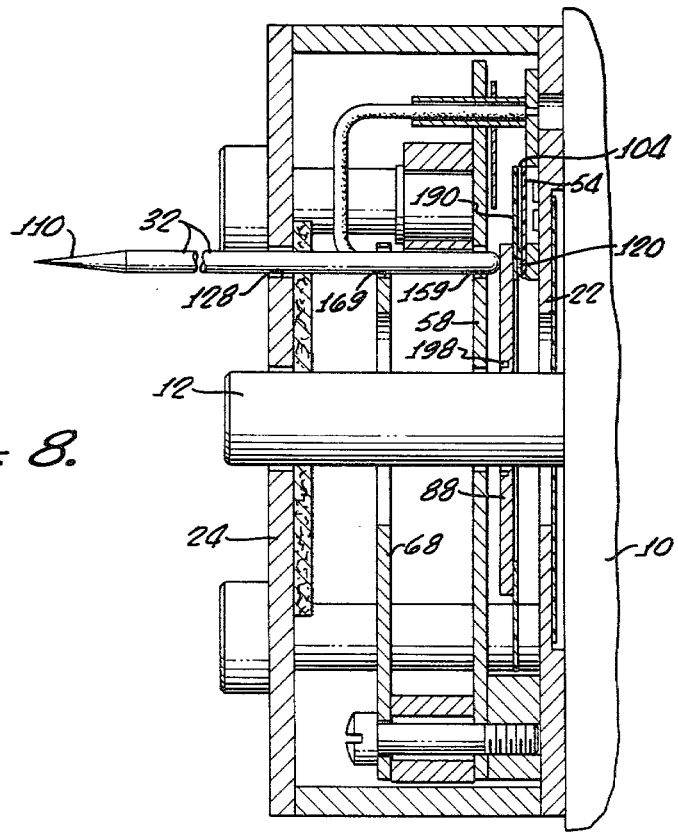

SHAFT ROTATION SENSOR

This application is a continuation-in-part of my application Ser. No. 003,108, filed Jan. 15, 1979 for Shaft Rotation Sensor, now abandoned.

BACKGROUND OF THE INVENTION

The present invention relates to sensing of shaft rotation and more particularly concerns methods and apparatus that enable precision sensing of shaft rotation by a low inertia device that is readily and accurately installed.

Shaft rotation sensors generally employ some type of optical, magnetic or mechanical contact arrangement to produce an electrical signal that indicates a rotational position or velocity, for example, of a rotatable shaft. Optical rotation sensing devices include both incremental and absolute rotary encoders, optical potentiometers, optical programmable switches, optical cams, optical protractors and the like, all of which embody a light source and light detector fixed relative to a rotatable shaft and a code or pattern wheel mounted for rotation with the shaft and interposed between the light source and detector so as to transmit or block light from the source to the detector in accordance with rotational position of the shaft.

Optical rotation sensors include two basic types. A more common or conventional type encoder includes its own shaft upon which the rotatable pattern wheel is mounted. A modular type is distinguished by the fact that it incoporates no shaft of its own but is adapted to be mounted directly upon the shaft of which rotation is to be sensed. The conventional encoder, which includes its own shaft upon which its pattern wheel is mounted, must incorporate bearings for rotatably mounting the shaft. The encoder shaft must be connected to the shaft of which rotation is to be sensed by some type of coupling. The encoder shaft, its bearings and the coupling all add mass to the system in addition to increasing complexity and cost of manufacture. Increased mass imposes increased inertial loads upon the system being monitored and thus introduces undesirable disturbances and decreases response times for given driving and braking forces. Further, such shaft, bearings and couplings also significantly increase the potential for error in the sensing and thus require greater care and expense in manufacture and installation or may provide output of more limited precision.

The modular encoder, having no shaft of its own, needs no bearings or additional coupling and thus may provide relatively less mass that must be rotated by the existing shaft and its drive. However, such devices are difficult and time consuming to assemble upon the shaft. Precision adjustment and rotational indexing are difficult to achieve. Assembly of such modular encoders upon the existing shaft requires removal of the instrument cover or housing and exposure of sensitive precision components. Such assembly, adjustment and alignment often require personnel with special skills and knowledge and special tools.

For example, a rotary pulse generator, which is also a shaft position encoder and digital tachometer, manufactured by Litton Systems Incorporated, employs a special aligning tool for assembly and alignment in the manner described in U.S. Pat. No. 3,900,732. In this modular device installation and alignment procedures set forth in the manufacturer's instructions include approximately 20 separate steps and generally involve initial installation of the commutator hub assembly (the pattern wheel) which is positioned by use of a special alignment tool. The next series of steps involves installation of the readout module which then must be aligned by a further series of steps involving use of an alignment tool. A final series of steps is required for establishment of the commutator air gap, which requires a special tool or gage. These procedures are accomplished with the cover removed and the sensitive precision parts exposed.

Among the many problems with the installation and alignment of prior modular encoders are the previously required employment of a relatively massive hub, having a bore of sufficient length to insure proper position of the plane of rotation of the rotating wheel assembly. Such a hub, of course, will add undesired mass thereby increasing inertia of the sensing instrument. Moreover, use of this type of hub introduces significant errors in positioning of the pattern wheel since the hub is generally secured to the shaft by means of a radially extending set screw. With conventional production tolerances a set screw can pull the center of the hub away from the center of the shaft by as much as six ten thousands of an inch which may then cause elements on the disc pattern to lead or lag nominal position by this amount. This is a significant and unacceptable magnitude of error in devices of extremely high precision.

Another disadvantage deriving from the use of the relatively large and massive hub in prior art modular devices is the difficulty of printing the desired code pattern on the assembled disc, after the code receiving portion of the disc has been assembled to the hub. Therefore, it is common to print the pattern upon the disc and, after such printing, the disc is secured to the hub itself. Even with a maximum of care and effort, unacceptable misalignment of the annular disc pattern with respect to the axis of the hub may occur.

Accordingly it is an object of the present invention to enable sensing of shaft rotation in a manner and with apparatus that avoids or minimizes above-mentioned problems.

SUMMARY OF THE INVENTION

In carrying out principals of the present invention in accordance with a preferred embodiment thereof a housing that is adapted to be fixed to a support in which a shaft is journalled confines a loosely positioned patterned disc assembly. The disc assembly has a mounting aperture dimensioned to be a press fit upon the shaft and is loosely retained within the housing with its mounting aperture substantially concentric with the housing aperture that is to receive the shaft. This enables the existing shaft to be pressed into the mounting aperture of the disc assembly to frictionally secure the assembly to the shaft for rotation therewith. According to a feature of the invention the pattern disc assembly, which is a press fit upon the rotating shaft, is automatically aligned and positioned by pressing against the disc assembly at a point that rotates relative to the assembly about the axis of rotation of the shaft. Most conveniently this is achieved by pressing against the disc while it rotates. The housing, which is fixed to the shaft support, bears a stop member that limits axial motion of the disc assembly when the latter is pressed toward stop member. This defines the gap between the disc assembly and the encoder detector. Pressing the rotating disc at a point that rotates about the shaft axis also insures perpendicularlity of the plane of disc rotation with respect to the rotation axis. According to another feature of the invention a unique hub configuration improves the assembly and mounting of the disc upon the shaft.

BRIEF DESCRIPTION OF THE DRAWINGS

FIG. 1 is an exploded perspective view of a modular shaft rotation encoder embodying principles of the present invention displaced from a shaft on which it may be mounted;

FIG. 3 is a view looking down upon the top of the encoder housing with parts broken away to show different components thereof;

FIG. 4 is an exploded view of the modular encoder of FIG. 1;

FIG. 6 is a fragmentary sectional view of a portion of the disc assembly having a modified hub configuration showing the hub in unstressed condition;

FIG. 7 illustrates the hub of FIG. 6 mounted upon a shaft;

FIG. 8 is a view similar to FIG. 2 showing the modular shaft rotation encoder with a modified stop member; and FIG. 9 is a view similar to FIG. 3 of the modification of FIG. 8.

DETAILED DESCRIPTION OF THE INVENTION

Figure 2:
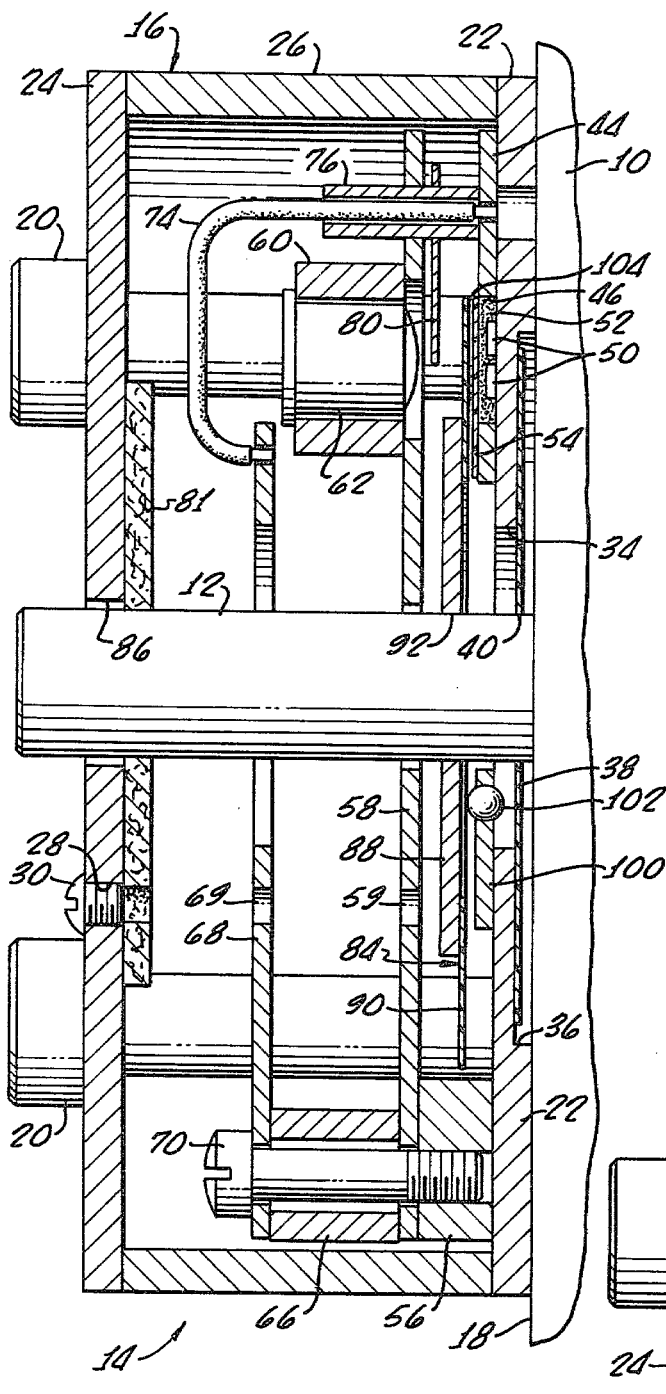
FIG. 2 is an enlarged sectional view of the encoder assembly of FIG. 1.

The methods and apparatus disclosed herein are applicable to a number of different types of shaft position sensors, whether optical, magnetic, electro-mechanical, etc. Principles of the invention are applicable to various types of optical rotation sensors including absolute rotary encoders, optical potentiometers, optical programmable switches, optical cams, optical protractors and other analogous devices. However, since the invention has been initially embodied in an optical incremental rotary encoder it is with respect to such an encoder that the invention will be described.

As illustrated in FIG. 1 a device 10, which may be a motor or some other portion of a system, includes a shaft 12 of which rotation is to be sensed. A rotary incremental shaft encoder will provide an output in the form of a series of electrical pulses each of which represents an increment of shaft rotation. Thus a count of the number of output pulses from a given position or time will indicate the total amount of shaft rotation. Repetition rate or frequency of the pulses represents shaft rotational velocity or angular velocity of the shaft. Such an encoder may also include an indexing track which produces an output signal at one or more selected positions of rotation of the shaft thereby enabling rotational alignment of the encoder with the system being monitored. A rotary incremental encoder 14, embodying principles of the present invention, is to be mounted on the existing shaft 12 of the apparatus 10. The encoder has a housing 16 that will be fixedly secured to a fixed shaft support including a fixed plate 18 by means of a plurality of screws 20 or bolts which extend entirely through the encoder housing into threaded engagement with threaded apertures in the mounting plate 18. The encoder housing and certain internal parts thereof, which will be more particularly described below, are apertured to receive the existing shaft 12 which extends into and may extend completely through the housing.

The encoder 14 has no rotatable shaft of its own and its rotating elements are to be a press fit upon the existing shaft 12 as will be described below.

The encoder housing includes a base plate 22 and an outer cover 24 secured in spaced relation to the base plate by means of an interposed ring 26 to which the cover and base plate are bonded, the housing components being further secured to one another and to the apparatus 19 by means of the bolts 20. Cover 24 has an installation aperture 28 normally sealed by a headed screw 30 which may be removed to permit installation.

As best seen in FIGS. 2 and 4 most of the elements of the encoder assembly are made of thin plates which are readily manufactured by inexpensive stamping procedures. Base 22 has a central opening 34 and a circular recess 36 formed on its outer surface for reception of a thin centering film or diaphragm 38 which is bonded thereto. The diaphragm 38 is formed with a central aperture 40 slightly larger than the outside diameter of the existing shaft 12 so as to enable the encoder to be accurately centered on the shaft during installation. Diaphragm 38 is made of a material that will flex and which will wear upon contact with the surfaces of the shaft so as to permit a slight amount of shifting of the assembly during installation and to minimize frictional drag of the centering film upon the shaft. The type of film commonly used for photographic film has been found to be suitable for the material of diaphragm 38.

A circuit board 44 is bonded to the inner side of base plate 22 and has a plurality of apertures 46, 48 which permit the mounting of pairs of energy sensing devices such as photo sensitive semiconductor chips 50 which are bonded directly to the inner surface of the base plate in an optically clear bonding cement 52 that fills the circuit board apertures and also secures a transparent glass grid 54 which bears a suitable code pattern on its surface.

A spacer 56 in the form of a ring having a portion thereof cut away to receive circuit board 44 is also bonded to the inside surface of base plate 22 and fixedly supports a centrally apertured partition plate 58 bonded thereto. An installation tool receiving aperture 59 is formed in the partition plate. The partition plate supports a holder 60 having a pair of circumferentially spaced apertures each carrying an energy source in the form of light emitting diodes 62, 63. A plurality of circumferentially spaced standoffs or spacer studs 66 are interposed between the partition plate and a printed circuit board 68 that is fixed to the spacers 56 by means of bolts 70 extending through stand-offs 66 into threaded engagement with apertures in the spacer 56. Circuit board 68 has an installation tool aperture 69 to permit insertion of installation tool 32.

Photo sensitive devices 50 are connected to the printed circuit board 44 and thence, via leads 74, are connected to the circuit board 68 which carries electronic circuitry for processing the electrical output signals of the photo sensitive devices. Leads 74 are carried through the printed circuit board 44 and through the partition plate 58. Mounted on the sleeves 76 are shades 80 which are bonded to the sleeves. Upon testing of the encoder, after manufacture and assembly, the sleeves bearing the shades may be rotated to block a selected amount of light that passes from the light sources 62, 63 to the photo sensitive devices 50. The sleeves, being a tight fit in partition plate 58, may be readily rotated within the aperture of the partition plate during initial testing.

Mounted to the inside of cover 24 is a felt shaft seal 81 having an aperture dimensioned to snubly receive the existing shaft 12. A connector fitting 82 is fixed to the housing and provides for passage of a multi-wire cable 84 from the encoder circuitry to the external equipment.

A rotatable pattern wheel or disc assembly 84 is loosely confined (prior to mounting of the encoder on the existing shaft) within the encoder housing so as to be substantially coaxial with the housing centering diaphragm aperture 40, the housing cover aperture 86, and the apertures in partition plate 58 and circuit board 68, through which the existing shaft 12 will pass upon installation.

The disc assembly 84 is formed of a thin hub 88 to which is bonded a thin, transparent glass disc or annulus 90 that bears the desired code or pattern. For the exemplary incremental optical rotary encoder the pattern on disc 90 comprises a first outer circular track having a number of alternatively opaque and transparent closely spaced areas thereon. An inner concentric track contains a single uniquely opaque or uniquely transparent area to provide indexing of the coded pattern wheel. The hub 88 has a central, shaft receiving aperture or bore 92 that is dimensioned to be a press fit upon existing shaft 12. The hub is made of a glass fiber reinforced plastic and both the hub thickness and its bore length are very small for reasons to be described below.

The disc assembly is loosely confined within the encoder housing, being confined against substantial radial shifting by the spacer 56 which almost entirely circumscribes the disc assembly. The spacer has an inside diameter slightly greater than the outside diameter of the glass annulus and thereby allows a small amount of radial shifting of the glass disc assembly within the encoder housing (prior to installation on the existing shaft) but still substantially centers the disc assembly with the hub aperture 92 coaxial with the aperture 40 of the centering film 38. The disc assembly is loosely positioned for limited axial motion within the housing by being confined between the fixed partition plate 58 on one side and a stop plate 100 and a stop ball 102 on the other side. Stop plate 100 is fixedly bonded to the bottom plate 22 and carries a fixed stop ball 102 which is a press fit within an aperture formed in the stop plate.

Installation of the encoder assembly upon the existing shaft 12 is simple and rapid and may be performed by unskilled personnel without disassembly of the encoder. The encoder assembly comprises a housing of which the components are bonded together and thus disassembly for installation is not feasible. The parts are mounted and properly positioned upon the existing shaft without disassembly of the encoder and without exposing any of the delicate interior components to ambient environment. The entire encoder assembly is simply manually pressed upon the existing shaft 12. The shaft enters the centering film aperture 40, then passes through the hub aperture 92 which comprises the mounting aperture for the disc assembly. All apertures of the encoder components, except disc assembly mounting aperture 92, are slightly larger than the shaft 12. A pressure of approximately $\frac{1}{2}$ to $1\frac{1}{2}$ pounds is all that is necessary to further slide the entire housing and disc assembly upon the shaft until the bottom plate 22 abuts the shaft support or mounting plate 18 (see FIG. 1) whereupon the bolts 20 are inserted through the encoder housing and threadedly secured in the mounting apertures in plate 18. This finally secures the encoder housing in position. The flexibility of centering film 38 enables a slight amount of radial displacement of the encoder housing to take place during the attachment of the housing by means of the bolts 20.

During insertion of the shaft into the housing through the disc assembly, the latter is moved to the left relative to the housing (as viewed in FIG. 2) into abutment with the partition plate 58. The partition plate then contacts the side of the hub 88 and, as the encoder assembly moves further onto the shaft and closer to the mounting plate 18, the partition plate presses against the hub and forces the disc assembly further onto the shaft.

With the bottom plate of the encoder housing abutting the mounting plate 18 and the bolts 20 tightened, the disc assembly is positioned at one side of its limited axial range of travel. It is in abutment with partition plate 58 and spaced a maximum distance from the stop plate 100 and stop ball 102 and from patterned glass grid 54. Now the sealing screw 30 is removed and a rigid slender elongated installation tool 32 is inserted through the installation hole 28 in housing cover 24. Shaft 12 is rotated and tool 32 is pressed against the hub with a force of about one half to one pound, as the shaft and hub rotate together (FIG. 5).

This operation creates a generally axially directed pressure against a point on the disc assembly, specifically on the surface of the hub at a point radially spaced from the rotation axis. This point of pressure rotates in a circular path around the axis of rotation as the shaft 12 rotates. The installation tool 32 is positioned within the installation aperture 28 which thus assists in restraining motion of the installation tool relative to the housing. Thus the forward, generally spherical end of the installation tool, which presses against the surface of the disc assembly hub, slides against this surface and exerts pressure against the surface along a circular path extending around the disc assembly coaxially of the rotation axis. This pressure causes the thin hub to bend and to "walk" along (to be shifted axially of) the shaft 12.

Figure 5:
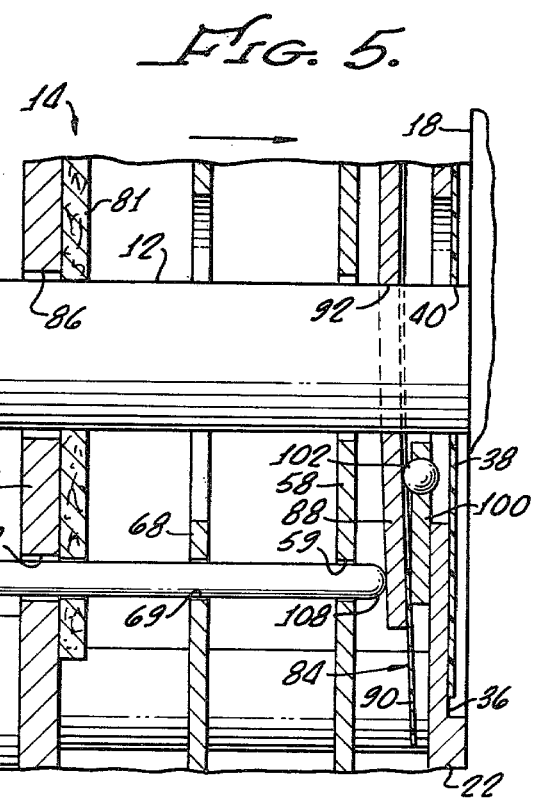
FIG. 5 illustrates certain parts of the encoder assembly in section during installation upon the shaft.

With a pressure of about $\frac{1}{2}$ to $1\frac{1}{2}$ pounds exerted by an operator holding the installation tool 32 in his hand, the resilient hub 88 bends as illustrated in FIG. 5 and shifts axially until the hub contacts the stop ball 102 as illustrated in FIG. 5. Further pressure of the installment tool upon the hub merely presses the disc assembly into contact with the edge of the stop plate 100. Thus, with the point of pressure of the installment tool 32 substantially at or just slightly inwardly of the outermost radial edge of stop plate 100, further bending of the disc assembly is prevented by contact of the assembly with the edge of the stop plate, whereby excess pressure of the installation tool upon the disc assembly will result in no damage to the latter.

Upon withdrawal of the assembly tool 32, the flexible hub 88 resiliently returns to its initial planar condition and the glass annulus 90 is spaced from the patterned grid 54 by a small precisely established gap. The length of this gap is critical in a precision instrument.

Not only is this gap precisely and automatically determined merely by exerting pressure upon the disc assembly by the installation tool, but the perpendicularity of the plane of rotation of the disc assembly is also precisely and automatically insured by the very same operation, at the same time. This is so because the installation is carried out while the shaft and the disc assembly are rotating. Thus pressure is applied by the installation tool at a point that traverses a circular path around the disc and, concomitantly, both axial motion of the disc and tilting of the disc about an axis normal to the shaft rotation axis are resisted by contact of the stop ball 102 with the disc hub at a point that likewise traverses the surface of the disc in a circular path that is concentric with the rotation axis. Preferably the tool apertures 28, 59 and 69 and the stop ball 102 lie on the same radius so that the ball nearly directly opposes the tool pressure, but is spaced radially inwardly of the tool contact point for design considerations.

Although bending of the hub is required to permit the hub to "walk" along the shaft, and also to achieve a press fit upon the shaft, it is not required to achieve positioning. Even if the hub did not bend for positioning (e.g., if the tool pressure were to be directly opposed by the stop ball), there is sufficient axial play (0.004 to 0.006 inches) inherent in the shaft bearings to avoid drag of continued contact between the hub and the stop ball.

After the disc assembly has been pressed along the shaft 12 until it contacts stop ball 102, installation tool 32 is withdrawn and indexing of the disc assembly rotationally about the shaft 12 may be accomplished as deemed necessary or desirable. For such rotational indexing, the installation tool 32 is provided with a sharp pointed end 110 opposite the rounded or spherical end 109 employed in the initial installation. The pointed end 110 is inserted into the housing through the installation apertures 28, 59, 69 until the point 110 presses against the surface of the hub 88 and is slightly embedded in the hub. Then the shaft 12 is carefully rotated while installation tool 32 prevents rotation of the disc assembly. Thus the latter is rotationally shifted about the shaft axis until the desired rotational index position of the disc assembly with respect to the shaft has been attained.

The selection of the disc assembly materials and dimensions is important for maximum precision and optimum installation. Such dimensions and material choices enable attainment of tolerances on dimensions of the gap and on perpendicularity of the disc assembly that are well within the requirements of precise operation.

Material presently preferred for the hub 88 is a laminated glass cloth material impregnated with a high temperature resisting, high tensile strength, low creep plastic. A polyimide plastic is presently preferred. A rigid polyimide glass laminate identified as Micaply PG 418 manufactured by The Mica Corporation of Los Angeles, California has been found to be suitable for the hub. As previously mentioned, the hub is an interference fit on the shaft. This fit must generate sufficient frictional force between the hub and the shaft 12 to prevent rotation of the disc assembly on the shaft in the presence of inertial torque caused by maximum shaft accelerations and decelerations. The hub material must be thick enough to resist non-uniform deforming when pressed upon the shaft and yet it must be sufficiently resilient, with a sufficiently low modulus of elasticity to allow a variation in the hub bore diameter within the sum of production tolerances of the shaft and hub bore, each of which may be in the order of two ten thousands of an inch. It is found that the hub material must have a low modulus of elasticity, a modulus within the range of approximately two to four million. The described modulus of elasticity is considerably higher than that of ordinary plastic such as nylon which has a modulus of elasticity in the neighborhood of about 400,000 and is considerably lower than that of steel which is approximately 30,000,000. If the hub modulus of elasticity is too low the interference fit may not create sufficient friction to adequately secure the hub to the shaft. If the modulus of elasticity is too high, either shaft and aperture tolerances must be so small so to be impractical, or an excessive force may be required to mount the disc assembly upon the shaft.

With a modulus of elasticity in the stated range, the hub will be sufficiently tight upon the shaft at the high end of a practical tolerance and yet will not require an excessive force to press it along the shaft during installation at the low end of the tolerance. It will also be removable. Although a sufficiently thin steel hub could be mounted as a press fit, the flexing at the aperture of such a hub (e.g., "oil-canning") would prevent its removal.

The hub material must have significant resistance to cold flow so that the frictional securing force between the hub bore and shaft will not significantly decrease during life of the encoder. It may be noted, as illustrated in the drawings that the interference fit between the hub bore and the shaft 12 is the sole means for attaching the rotating disc assembly to the shaft.

Not only does the choice of the polyimide impregnated glass cloth for the hub provide the proper stiffness and resistance to cold flow but it also provides a proper match of the coefficients of thermal expansion of the several elements. Matching of the coefficients of thermal expansion of the shaft, hub and patterned glass annulus within reasonable limits insures that differential expansion will not increase the relative size of the hub aperture and thereby decrease the friction generated by its force fit upon the shaft. Matching expansion of the hub and glass is important to avoid deflection, buckling or wrinkling of the glass. Coefficients of thermal expansion of the steel shaft, the polyimide impregnated glass hub and glass disc all are in the order of $6 \times 10^{-6}$ inches per inch per degree Fahrenheit.

A factor of major significance is the very small thickness of the hub and of the glass annulus. The hub and glass are both thin to decrease mass and thus decrease inertial forces that would tend to torque the disc assembly in the presence of high acceleration. An even more important factor in determining hub thickness is the ability to install the disc assembly by pressing on the hub at a point traversing a circular path, as described in connection with FIG. 5. If the hub (actually the hub bore) is too thick, an excessive force is required to shift it axially on the shaft. In the alternative, if the interference fit of a thicker hub upon a shaft is relieved, as by increase in the hub bore dimensions, for example, the thicker hub may be more readily shifted along the shaft but may no longer have sufficient frictional securement to the shaft to resist inertial torques. Further, the thicker the hub the greater its mass and the greater the inertia. Similarly, a thin glass annulus is required since the thicker the glass the greater the thickness required of the hub to support the glass and to generate a greater frictional force for resistance of inertial torques. In summary, a thicker hub requires smaller manufacturing tolerances to avoid too tight a fit upon a shaft having a diameter at the high side of the tolerance and to avoid too loose a fit upon a shaft having a diameter at the low side of the tolerance.

For a diameter of shaft 12 in the range of $\frac{1}{8}$ to $\frac{1}{2}$ inch, the hub diameter is preferably within the range of 0.8 to 1.2 inches. The diameter of the glass annulus is between one and two inches and the glass thickness is preferably between 0.004 and 0.015 inches.

Shaft diameter should have a tolerance of +0.0000 and −0.0005 inches for the desired press fit. With a hub material having a modulus of elasticity as described herein the diameter of the hub bore must be less than the lower end of the range of diameters of the shaft by 0.0003 to 0.0010 inches.

As previously mentioned, hub thicknesses must be limited in order to enable the described installation procedures and resistance to inertial torque. Thus hub thicknesses greater than about 0.04 inches may result in loss of the benefits of the interference fit of the disc assembly upon the shaft. A hub thickness in the range of about 0.006 to 0.032 inches is presently preferred. The small thickness of the hub, which allows a small thickness of the glass, greatly decreases inertia of the assembly. This enables a greater speed of response of the shaft and disc assembly to rotational acceleration and deceleration, or lighter and less powerful driving components, which themselves further reduce inertia.

Since the hub mounting aperture 92 positions both the hub and the pattern disc 90 relative to the rotation axis, it is essential, for a precision instrument, that the glass pattern disc 90 and, more particularly, the annular pattern or patterns thereon, are precisely concentric with the center of the hub aperture 92. Prior devices have employed a hub having significant thickness, being as much as one half inch in length, in order to insure proper positioning of the hub on the shaft. The size and mass of such a hub make it difficult to produce the desired pattern on the glass annulus after it has been assembled to the hub. Accordingly in prior devices, assembly of the disc to the hub is carried out only after the pattern is formed on the disc. This must be performed with extreme precision and even so it may introduce undesirable error. With the exceedingly thin hub employed in the practice of the present invention the glass annulus is fixedly secured to the hub prior to producing the code pattern on the glass annulus. The assembly of glass annulus (not yet bearing its code pattern) and hub is then mounted as a force fit upon a precision shaft. A photographic master bearing the desired pattern is likewise mounted as a force fit upon the same shaft and therefore is precisely concentric with the center of rotation of the hub aperture. With the disc assembly and master pattern thus coaxially positioned the pattern may be produced upon the glass disc by conventional contact photographic printing methods. In this connection it may be noted that further handling of the disc assembly after the contact printing of the pattern is required to complete the photographic processing. The very small thickness of the disc assembly enables a large number of such assemblies to be mounted on a single shaft thereby greatly facilitating handling and subsequent processing.

The encoder described above provides for the many advantages that have been discussed including low inertia, improved installation, and decreased manufacturing costs, however the design of hub 88 limits the accuracy potential of the unit. Insertion of shaft 12 into hub 88 causes the hub to assume a concaved shape in the direction of glass disc 84. This distortion causes gap 104 between the disc and the reticule to be large near the hub and small at the perimeter of the disc. This effect is more pronounced for shafts at the large end of the diameter-tolerance range. Also the elastic characteristics of the hub, the glass and bond inbetween are not usually uniform, which causes the concaved shape not to be uniform, which in turn causes the mean gap 104 to vary as disc 190 rotates. This non-uniform gap increases the readout accuracy of the unit.

FIGS. 6 and 7 illustrate a portion of a hub disc assembly that is identical to that previously described and is to be used in modular shaft rotation sensor identical to that previously described, except for the unique configuration of the hub in and about the hub bore. As illustrated in FIGS. 6 and 7, a glass annulus 190 is cemented to a thin hub 188 just as previously described. In this arrangement, the hub is provided with a bore 192 that is flared from a first side 194 of the hub to a second side 196, the side 196 being the side of the hub to which the glass disc 190 is secured. Thus, the hub bore is inclined or tapered from a diameter at hub side 194 that is smaller than the nominal shaft diameter to a greater diameter at side 196, a diameter that is not less than the nominal shaft diameter and preferably is greater than the shaft diameter at the high end of shaft diameter tolerance. In a presently preferred embodiment the hub bore is flared so that the bore surface as viewed in the section of FIG. 6, is a segment of a circular curve having a center C that is displaced above and to the left of the periphery of the hub (as viewed in FIG. 6). Although a curved flare or taper for the bore is shown it will be readily appreciated that a straight line or linear taper may also be employed.

In addition to the flared configuration of the hub bore, the hub is provided with a continuous circular groove 198 that circumscribes the bore and opens outwardly from the hub side 194. Thus, the side of the hub adjacent the smaller diameter portion of the bore is recessed or relieved at one or more points, preferably continuously as illustrated, the recess or recesses circumscribing the bore to allow radially outward displacement of portions of the hub material between the bore and a recess. Thus, when disc assembly is pressed upon the shaft it is still a press fit or very tight fit upon the shaft. However, portions of the hub material between the shaft and the groove 198 are displaced radially outwardly as shown in FIG. 7, which illustrates the hub in position upon the shaft. FIG. 6 illustrates the hub in unstressed condition prior to being forced upon the shaft.

It will be seen that the effect of the flared bore that provides a smaller diameter at the hub side containing the groove, is to keep the radially outwardly displaced hub material concentrated on the hub side 194. A concomitant effect is to provide a space for the displaced hub material without stressing that portion of the hub that is radially outward of the groove. Stated otherwise, the effect of the described hub configuration is to provide a degree of isolation of the radially outward portions of the hub from the forces involved in the interference fit of the disc assembly upon the shaft.

It will also be seen that the groove enables resilient deflection of the hub material between the bore and the groove and between the bottom of the groove and the side 196. This portion of the hub therefore acts as a spring to provide gripping force on the shaft. Accordingly the gripping force and spring rate can be varied by varying the depth of the groove and the thickness of the material radially between the bore and the groove, within the elastic limits of the material. This deflection of the hub material near the bore is greater and more readily varied than is the pure compressive deflection of an interference fit hub without such groove.

Another significant advantage of the hub configuration described in FIG. 6 is the significantly decreased criticality of dimensions and tolerances required in manufacture. Large variations in dimensions will provide substantially similar satisfactory results. For example, a typical hub thickness for use in the configuration of FIG. 6 is 0.032 inches, approximately. Shaft tolerances may be +0.0000 and −0.0005 inches. The small diameter of the hub bore (at hub side 194) is nominally 0.0010 inches less than the nominal shaft diameter with a preferred tolerance of +0.0000 and −0.0003. Preferably the large diameter of the hub bore is greater than the maximum shaft diameter so that the shaft may readily enter the flared bore at the larger part of the bore. In the described arrangement, the interference fit can vary from −0.0005 inches to −0.0013 inch interference.

Another advantage of the hub configuration described in FIG. 6 is that it becomes possible to set gap 104 by a much simpler and more accurate arrangement as illustrated in FIGS. 8 and 9. In this arrangement, the stop plate 100 and stop ball 102 of the first described embodiment are not employed. Thus, the installation tool apertures 28, 69 and 59 are not needed and are not employed. The stop member fixed to the base plate is provided in this arrangement by a simplified stop member in the form of a thin gap shim or plate 120 which is bonded to the reticle glass 54. Installation tool apertures 128, 169 and 159 are provided and positioned as required in outer cover 24, circuit board 68 and partition plate 58 for reception of the installation tool 32 so that the latter can press against the hub 88 at a point directly opposite the gap shim 120. The installation procedures and adjustments are substantially the same as described above in connection with the first described embodiment. The gap shim is made to a thickness slightly less than the predetermined length of the gap 104. The disc assembly is pressed by the installation tool in the manner previously described until the disc abuts the gap shim 120. When the force of the installation tool is removed a spring back of the hub allows a clearance between the glass disc and the reticle glass of the detector. This arrangement was not possible with the solid hub design of FIGS. 1–5 due to the concavity of the disc and the large deflection of the disc when pushed by the thrust pin, resulting in damage to the disc and reticule.

There have been described improved shaft rotation sensors and methods for manufacture and installation thereof which add an exceedingly low rotating mass to the existing system, enable significantly increased response rates, provide for increased precision with fast and extremely simple installation procedures, and provide for decreased manufacturing costs of the encoder assembly which is automatically adjusted on installation.

The foregoing detailed description is to be clearly understood as given by way of illustration and example only, the spirit and scope of this invention being limited solely by the appended claims.

What is claimed is:

1. For use in a modular device for sensing rotation of a shaft journalled in a support, said device having no shaft of its own but being adapted to be mounted upon a shaft of which rotation is to be sensed, the combination comprising, a housing adapted to be fixed to said support and having a housing aperture, said housing being free of any shaft therein, a patterned disc assembly loosely positioned within said housing and having a mounting aperture dimensioned to be a press fit upon a shaft to be inserted therein, and means for loosely retaining said disc assembly within said housing with said mounting aperture substantially concentric with said housing aperture, whereby said shaft may be inserted into said housing aperture and pressed into said mounting aperture to frictionally secure the disc assembly to the shaft for rotation therewith, and said housing may be secured to said shaft support.

2. The device of claim 1 wherein said means for retaining said disc assembly includes means within said housing for restraining axial motion of said disc assembly from said housing aperture, whereby said means for restraining will push said disc assembly on said shaft as the shaft is inserted into the housing.

3. For use in a modular device for sensing rotation of a shaft journalled in a support, the combination comprising a housing adapted to be fixed to said support and having a housing aperture, a patterned disc assembly loosely positioned within said housing and having a mounting aperture dimensioned to be a press fit upon said shaft, means for loosely retaining said disc assembly within said housing with said mounting aperture substantially concentric with said housing aperture, whereby said shaft may be inserted into said housing aperture and pressed into said mounting aperture to frictionally secure the disc assembly to the shaft for rotation therewith, and said housing may be secured to said shaft support, and means for pressing against said disc at points thereon lying on a circle concentric with said mounting aperture.

4. The device of claim 3 including stop means carried by said housing for opposing pressure of said installation means to limit shifting of said disc assembly in response to pressure of said installation means.

5. For use in a modular device for sensing rotation of a shaft journalled in a support, the combination comprising a housing adapted to be fixed to said support and having a housing aperture, a patterned disc assembly loosely positioned within said housing and having a mounting aperture dimensioned to be a press fit upon said shaft, means for loosely retaining said disc assembly within said housing with said mounting aperture substantially concentric with said housing aperture, whereby said shaft may be inserted into said housing aperture and pressed into said mounting aperture to frictionally secure the disc assembly to the shaft for rotation therewith, and said housing may be secured to said shaft support, and a retractable tool adapted to be pressed into said housing against said disc assembly to axially shift said disc assembly relative to said housing.

6. The device of claim 5 including means for restraining lateral motion of said tool while said shaft and disc assembly rotate to cause the point of contact of said tool and disc assembly to traverse a circular path about said disc assembly.

7. For use in a modular device for sensing rotation of a shaft journalled in a support, the combination comprising a housing adapted to be fixed to said support and having a housing aperture, a patterned disc assembly loosely positioned within said housing and having a mounting aperture dimensioned to be a press fit upon said shaft, means for loosely retaining said disc assembly within said housing with said mounting aperture substantially concentric with said housing aperture, whereby said shaft may be inserted into said housing aperture and pressed into said mounting aperture to frictionally secure the disc assembly to the shaft for rotation therewith, and said housing may be secured to said shaft support, and retractable tool means for contacting said disc assembly to effect rotation thereof relative to said shaft whereby said disc assembly may be indexed relative to said shaft.

8. The device of claim 7 wherein said housing has an installation aperture adapted to receive said tool means, and wherein said tool means comprises an elongated rod having means for detachably connecting said rod to said disc assembly, whereby said shaft may be rotated while the disc assembly pressed thereon is restrained against rotation with the shaft.

9. The device of claim 1 wherein said means for retaining said disc assembly within said housing comprises spacer means fixed to the housing adjacent spaced points on the circumference of said disc assembly, said spacer means being adjacent to but radially spaced from said disc assembly to permit a limited amount of radial displacement of said disc assembly relative to said housing.

10. For use in a modular device for sensing rotation of a shaft journalled in a support, the combination comprising a housing adapted to be fixed to said support having a housing aperture, a patterned disc assembly loosely positioned within said housing and having a mounting aperture dimensioned to be a press fit upon said shaft, means for loosely retaining said disc assembly within said housing with said mounting aperture substantially concentric with said housing aperture, whereby said shaft may be inserted into said housing aperture and pressed into said mounting aperture to frictionally secure the disc assembly to the shaft for rotation therewith, and said housing may be secured to said shaft support, said housing including a base plate adapted to be fixed to said support and a housing cover fixed to and axially spaced from said base plate, said cover having a tool aperture therein radially spaced from said mounting aperture, and tool means adapted to be inserted through said tool aperture and pressed into engagement with said disc assembly for positioning said disc assembly relative to said shaft.

11. The device of claim 10 wherein said base plate has an aperture therein of a diameter considerably greater than the diameter of said shaft, and including a centering film secured to said base plate and having said housing aperture formed therein, said housing aperture having a diameter slightly greater than the diameter of said shaft whereby said housing aperture is a close fit upon said shaft, said centering film being flexible and having a relatively low resistance to abrasion whereby said centering film will impose little restraint upon the mounting of said housing and rotation of said shaft.

12. The device of claim 10 including a stop member secured to said base plate and adapted to contact said disc assembly upon axial shifting thereof toward said base plate to thereby establish a limiting position of axial adjustment of said disc assembly.

13. The device of claim 10 including a detector mounted upon said base plate within said housing, a light source for illuminating said detector through said disc assembly, and means for limiting axial shifting of said disc assembly toward said detector.

14. For use in a modular device for sensing rotation of a shaft journalled in a support, the combination comprising a housing adapted to be fixed to said support and having a housing aperture, a patterned disc assembly loosely positioned within said housing and having a mounting aperture dimensioned to be a press fit upon said shaft, means for loosely retaining said disc assembly within said housing with said mounting aperture substantially concentric with said housing aperture, whereby said shaft may be inserted into said housing aperture and pressed into said mounting aperture to frictionally secure the disc assembly to the shaft for rotation therewith, and said housing may be secured to said shaft support, said housing comprising a base plate, a cover, and a ring interposed between and secured to said base plate and cover, said device including detector means secured to said base plate within said housing, transparent grid means secured to said base plate adjacent said detector means, said disc assembly being axially movable toward said grid means, said means for retaining comprising a spacer fixed to said housing and circumscribing at least a portion of said disc assembly and a partition plate fixed to said housing between said disc assembly and said cover, a light source mounted to said partition plate to transmit light through an outer portion of said disc assembly and through said grid means to said detector means, and stop means fixed to said base plate for limiting axial motion of said disc assembly toward said grid means.

15. The device of claim 1 wherein said disc assembly includes a thin, resiliently flexible, apertured hub and a patterned annulus bonded thereto, and wherein said hub has a thickness of not more than about 0.04 inches.

16. The device of claim 1 wherein said disc assembly includes a thin, resiliently flexible, apertured hub and a patterned annulus bonded thereto, and wherein said hub has a thickness in the range of about 0.006 to 0.032 inches, said hub having a modulus of elasticity in the range of about two to six million, whereby the disc assembly may be manually mounted upon the shaft with a press fit sufficient to resist inertial torques experienced upon shaft accelerations and decelerations.

17. For use in a modular device for sensing rotation of a shaft journalled in a support, the combination comprising a housing adapted to be fixed to said support and having a housing aperture, a patterned disc assembly loosely positioned within said housing and having a mounting aperture dimensioned to be a press fit upon said shaft, means for loosely retaining said disc assembly within said housing with said mounting aperture substantially concentric with said housing aperture, whereby said shaft may be inserted into said housing aperture and pressed into said mounting aperture to frictionally secure the disc assembly to the shaft for rotation therewith, and said housing may be secured to said shaft support, said disc assembly including a hub having a flared bore for receiving said shaft, said hub having a recessed area opening solely in one side of said bore, said recessed area being radially spaced from and extending about said bore.

18. A method of preparing and mounting the pattern disc of a shaft rotation sensor upon a shaft of which rotation is to be sensed, comprising the steps of forming a disc with an aperture slightly smaller than the diameter of said shaft, pressing said shaft into said aperture, rotating said shaft and disc, and pressing against said disc at points in a circular path extending around said disc as the disc and shaft rotate.

19. The method of claim 18 wherein said step of pressing includes bending said disc against a fixed stop while the disc rotates.

20. The method of claim 18 wherein said step of pressing includes the step of exerting a force upon said disc sufficient to shift the disc axially along said shaft.

21. The method of claim 18 wherein said step of pressing includes the step of exerting a force upon said disc sufficient to tilt the plane of said disc relative to its axis of rotation.

22. The method of claim 18 including the step of positioning a stop member at a point fixed relative to said shaft, and wherein said step of pressing comprises bending said disc as it rotates and terminating said pressing against the disc when the bent disc engages the stop member.

23. The method of claim 18 wherein said step of pressing against said disc comprises moving an installation tool into sliding engagement with a face of said disc and restraining rotation of said tool.

24. The method of claim 18 wherein said step of forming comprises forming a hub having said aperture therein, bonding an annulus to said hub, and forming a pattern on said annulus concentric with said aperture.

25. The method of claim 18 wherein said step of forming comprises forming a hub having said aperture therein, bonding an annulus to said hub, mounting said hub and annulus with a force fit upon a pattern shaft, forming a master pattern with an aperture dimensioned to tightly receive said pattern shaft, mounting said master pattern with a force fit upon said pattern shaft adjacent said hub and annulus, and forming the pattern of said master pattern upon said annulus.

26. The method of claim 18 including the step of rotationally adjusting said hub and annulus relative to said shaft by rotating said shaft while restraining rotation of said hub and annulus.

27. The method of claim 18 including the step of rotationally adjusting said hub and annulus relative to said shaft by shifting an adjustment tool into non-rotational engagement with said hub, rotating said shaft, and restraining rotation of said tool.

28. A device for sensing rotation of a shaft journalled in a support, said device comprising a detector fixed relative to said support, an energy source fixed relative to said support and spaced from said detector, a patterned disc assembly on said shaft and including a portion interposed between said energy source and said detector for intermittently blocking transmission of energy from said source to said detector as said disc assembly rotates, said disc assembly having a bore that is an interference fit upon said shaft, and installation means for exerting a force on said disc assembly at points thereon lying on a circle concentric with the axis of rotation of said shaft.

29. The device of claim 28 wherein said disc assembly portion is spaced from said detector by a gap of predetermined gap length, and wherein a gap shim having a thickness slightly less than said gap length is fixed to said detector adjacent said disc assembly portion.

30. The device of claim 28 wherein said disc assembly includes means circumscribing said bore for decreasing resistance to radial expansion of said bore about said shaft.

31. The device of claim 30 wherein said means for decreasing resistance comprises a recess in one side of said disc assembly, said bore having a diameter that tapers toward said one side.

32. The device of claim 28 wherein said disc assembly has a groove formed in one side thereof circumscribing said bore, and wherein said bore tapers from a diameter at said one side that is less than the diameter of said shaft to a greater diameter at the other side of said assembly.

33. The device of claim 28 wherein said bore is flared.

34. The device of claim 28 wherein said interference fit is sufficient to resist torque exerted on the disc assembly upon rotational acceleration of said shaft and wherein said interference fit permits manual shifting of said disc assembly axially of said shaft.

35. The device of claim 34 wherein said disc assembly comprises an annulus bearing an energy blocking pattern thereon and a thin hub bonded to said annulus, said bore being formed in said hub and having a length not more than 0.04 inches.

36. The device of claim 35 wherein said hub is made of a glass fiber reinforced plastic having a modulus of elasticity between two and six million.

37. The device of claim 34 including means for establishing a small clearance between said disc assembly and said detector, said means for establishing clearance comprising a stop member fixed relative to said support and spaced from said disc assembly by a predetermined distance, said disc assembly being resiliently flexible, wherein said disc assembly, in response to the force exerted by said installation means, may be resiliently flexed and shifted axially of said shaft toward said detector and stop member and may be pressed into engagement with said stop member to limit such axial shifting when the disc assembly is at a desired clearance distance from said detector.

38. The device of claim 37 wherein said stop member comprises a gap shim fixed to said detector.

39. The device of claim 34 including a stop member connected to said support to establish clearance between said disc assembly and said detector, said disc assembly including a resiliently flexible hub having said bore formed therein, said hub adapted to be resiliently flexed and shifted along said shaft until it attains an axial position wherein it abuts said stop member when the hub is flexed.

40. A shaft rotation sensor comprising a shaft adapted to be rotated about a shaft axis, a detector, an energy source fixed relative to said detector and spaced therefrom, and a rotary member fixed to the shaft for rotation therewith between said detector and energy source, said rotary member having a hub with a shaft receiving bore extending therethrough, said bore having an unstressed diameter at one side of said hub that is less than the diameter of said shaft, and having a diameter at the other side of said hub that is not less than the diameter of said shaft, and at least one recess means formed in said one side of said hub and lying in an annular area spaced radially outwardly of said bore, said recess means opening solely in said one side of said hub, whereby said rotary member may be slid onto said shaft with at least that portion of the hub bore adjacent said one hub side being a tight fit upon said shaft.

41. The device of claim 40 wherein said recess means comprises a continuous circular groove formed in said one side of said hub and extending about said bore.

* * * * *